(12) United States Patent
Zhang (10) Patent No.: US 8,907,427 B2
(45) Date of Patent: Dec. 9, 2014

(54) SEMICONDUCTOR DEVICE INCLUDING LOW-K DIELECTRIC CAP LAYER FOR GATE ELECTRODES AND RELATED METHODS

(71) Applicant: STMicroelectronics, Inc, Coppell, TX (US)

(72) Inventor: John H Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/668,376

(22) Filed: Nov. 5, 2012

(65) Prior Publication Data

US 2014/0124865 A1    May 8, 2014

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC 257/369; 257/377; 257/E27.06; 257/E27.062

(58) Field of Classification Search
CPC ...... H01L 21/8238; H01L 29/49; H01L 29/94

USPC ................ 257/368, 369, 374, 377, 382, 412, 257/E27.06, E27.062
See application file for complete search history.

(56) References Cited

U.S. PATENT DOCUMENTS

| 7,244,645 | B2* | 7/2007 | Kim et al. .................... 438/216 |
| 7,592,262 | B2 | 9/2009 | Huang et al. |
| 7,883,944 | B2 | 2/2011 | Zhu et al. |
| 7,964,916 | B2* | 6/2011 | Or-Bach et al. ............... 257/347 |
| 2011/0281410 | A1 | 11/2011 | Liu et al. |
| 2012/0261754 | A1* | 10/2012 | Cheng et al. .................. 257/347 |
| 2012/0286376 | A1* | 11/2012 | Hung ............................ 257/412 |

* cited by examiner

*Primary Examiner* — Hoai V Pham
(74) *Attorney, Agent, or Firm* — Allen, Dyer, Doppelt, Milbrath & Gilchrist, P.A.

(57) ABSTRACT

A semiconductor device may include a substrate, source and drain regions in the substrate, a recessed epitaxial channel layer in the substrate between the source and drain regions, and a high-K gate dielectric layer overlying the recessed epitaxial channel layer. The semiconductor device may further include a gate electrode overlying the high-K gate dielectric layer, a dielectric cap layer in contact with top and sidewall portions of the gate electrode, the dielectric cap layer having a lower dielectric constant than the high-K gate dielectric layer, and source and drain contacts coupled to the source and drain regions.

16 Claims, 15 Drawing Sheets

SEMICONDUCTOR DEVICE INCLUDING LOW-K DIELECTRIC CAP LAYER FOR GATE ELECTRODES AND RELATED METHODS

FIELD OF THE INVENTION

The present invention relates to the field of electronic devices and, more particularly, to semiconductor devices and related methods.

BACKGROUND OF THE INVENTION

As the integration density of semiconductor field effect transistor (FET) devices continues to increase, with conventional configurations this may cause problems such as short channel effects and drain induced barrier lowering (DIBL) as smaller and smaller transistors are integrated in bulk devices. Another problem that may arise with bulk integration is achieving a desired sub-threshold slope (SS), for example.

Various semiconductor configurations have been developed to address challenges associated with increasing integration densities. One example is set forth in U.S. Pat. Pub. No. 2011/0281410 to Liu et al. This reference discloses a transistor having an epitaxial channel and a method for fabricating a semiconductor device having an epitaxial channel. The method includes forming a hard mask on a substrate and forming an opening in the hard mask. The opening is geometrically characterized by a long dimension and a short dimension, and the opening is arranged in a predetermined manner relative to the channel region of a transistor. An epitaxial material is formed in the opening that induces strain in substrate regions proximate to the epitaxial material. The epitaxial material is confined to the opening, such that an epitaxial channel is formed. A transistor is fabricated in proximity to the epitaxial channel, such that the strain induced in the substrate provides enhanced transistor performance. By confining the epitaxial material to a predefined channel in the substrate, plastic strain relaxation of the epitaxial material is minimized and a maximum amount of strain is induced in the substrate.

U.S. Pat. No. 7,883,944 to Zhu et al. discloses a method of forming a semiconductor device that may include providing a semiconductor layer including raised source and raised drain regions that are separated by a recessed channel having a thickness of less than 20 nm, and forming a spacer on a sidewall of the raised source and drain regions overlying a portion of the recessed channel. In a following process step, a channel implantation is performed that produces a dopant spike of opposite conductivity as the raised source and drain regions. Thereafter, the offset spacer is removed, and gate structure including a metal gate conductor is formed overlying the recessed channel.

Despite the existence of such configurations, further enhancements may be desirable to more effectively address semiconductor device integration issues such as SCE and DIBL, for example.

SUMMARY OF THE INVENTION

A semiconductor device may include a substrate, source and drain regions in the substrate, a recessed epitaxial channel layer in the substrate between the source and drain regions, and a high-K gate dielectric layer overlying the recessed epitaxial channel layer. The semiconductor device may further include a gate electrode overlying the high-K gate dielectric layer, and a dielectric cap layer in contact with top and sidewall portions of the gate electrode, where the dielectric cap layer has a lower dielectric constant than the high-K gate dielectric layer. Source and drain contacts may be coupled to the source and drain regions. The semiconductor device may accordingly be less susceptible to SCEs, and may have improved DIBL characteristics, for example.

More particularly, the gate electrode may include an inner metal gate electrode portion and an outer metal barrier portion. By way of example, the inner metal gate electrode portion may comprise aluminum, and the outer metal barrier portion may comprise TaNi. Moreover, the gate electrode may further include a work function layer on the outer metal barrier portion, which may comprise TiN, for example.

Also by way of example, the recessed epitaxial channel layer may comprise at least one of silicon and germanium, and the source and drain contacts may comprise metal. The semiconductor device may further include a shallow trench isolation (STI) region in the substrate. Also, the semiconductor device may further include respective silicide regions between each of the source and drain regions and the source and drain contacts.

A related method for making a semiconductor device may include forming source and drain regions in a substrate, forming a recessed epitaxial channel layer in the substrate between the source and drain regions, forming a high-K gate dielectric layer overlying the recessed epitaxial channel layer, and forming a gate electrode overlying the high-K gate dielectric layer. The method may further include forming a dielectric cap layer in contact with top and sidewall portions of the gate electrode, where the dielectric cap layer has a lower dielectric constant than the high-K gate dielectric layer. The method may additionally include forming source and drain contacts coupled to the source and drain regions.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
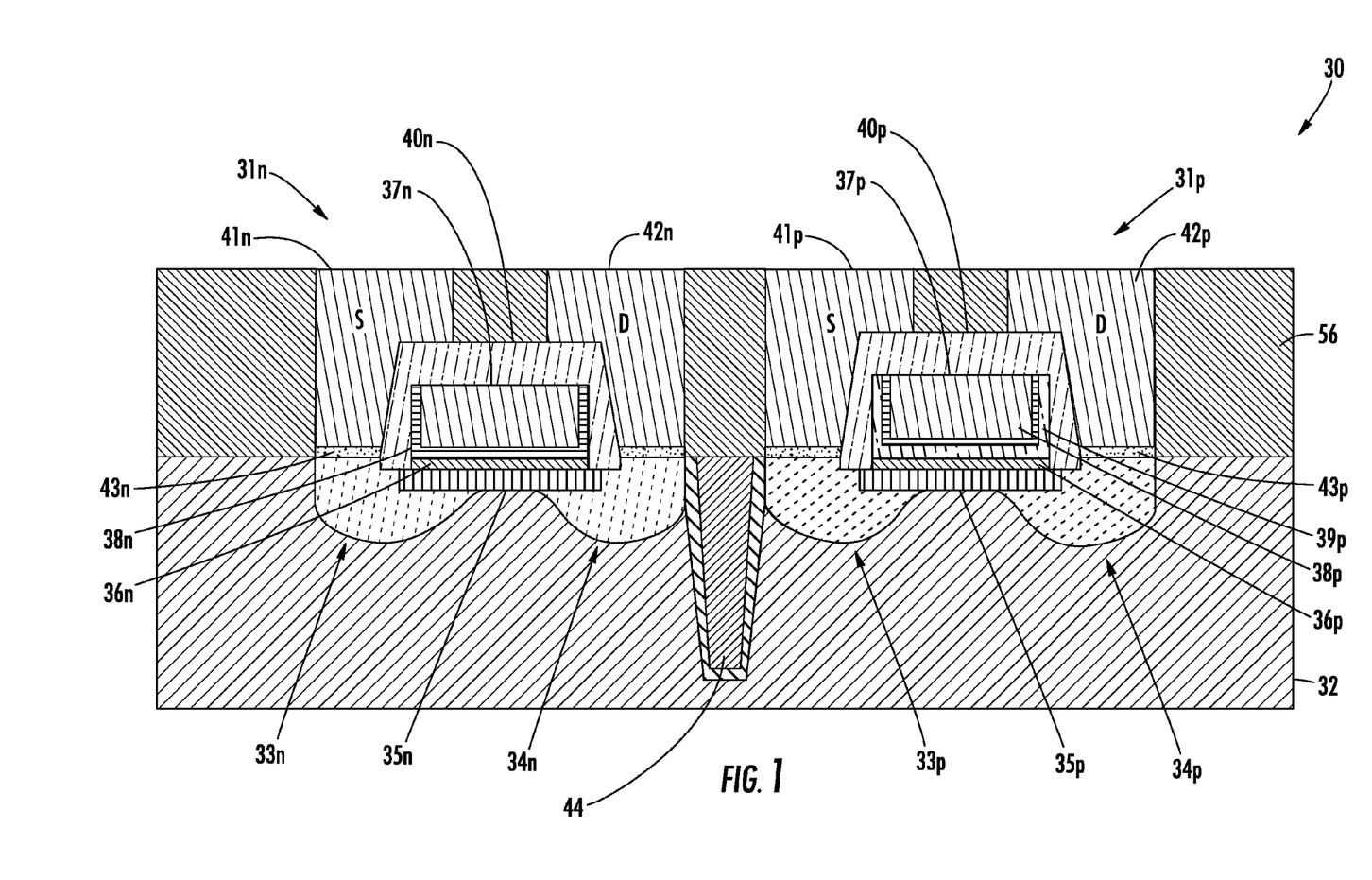
FIG. 1 is a schematic cross-sectional diagram of a semiconductor device in accordance with the invention.
Figure 2:
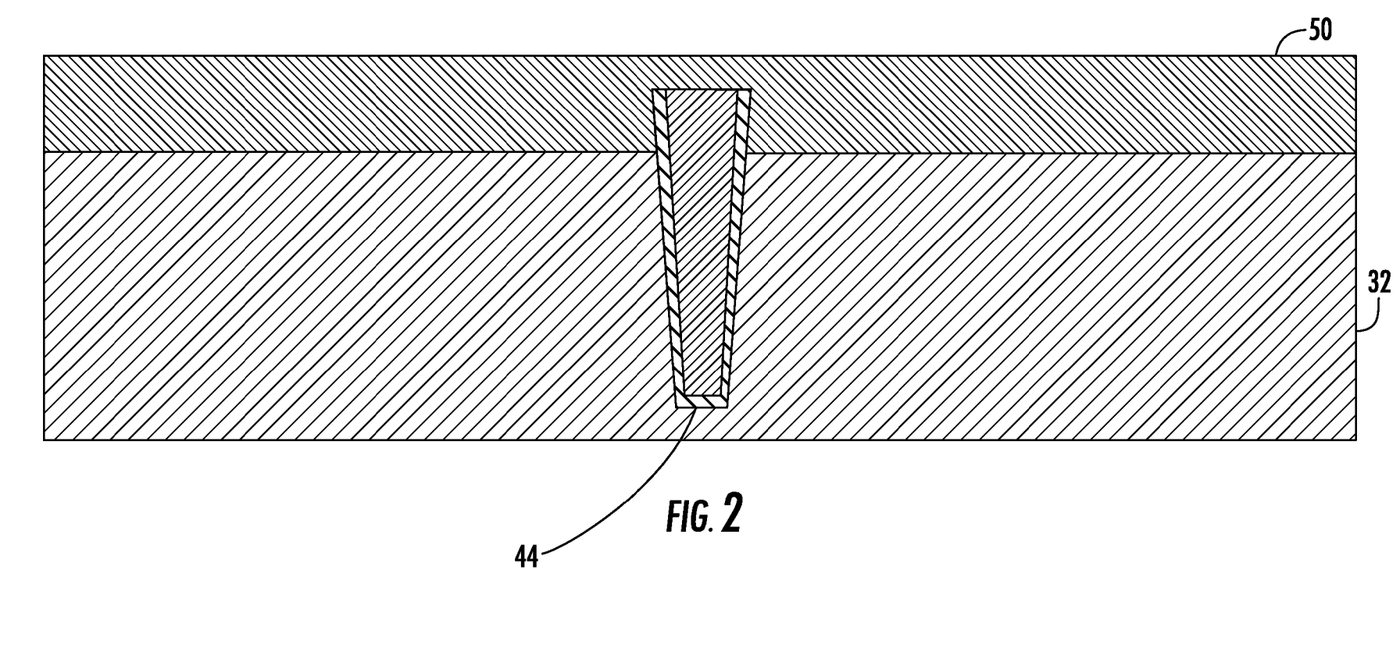
FIGS. 2-15 are schematic cross-sectional diagrams illustrating method aspects associated with making the semiconductor device of FIG. 1.
Figure 3:
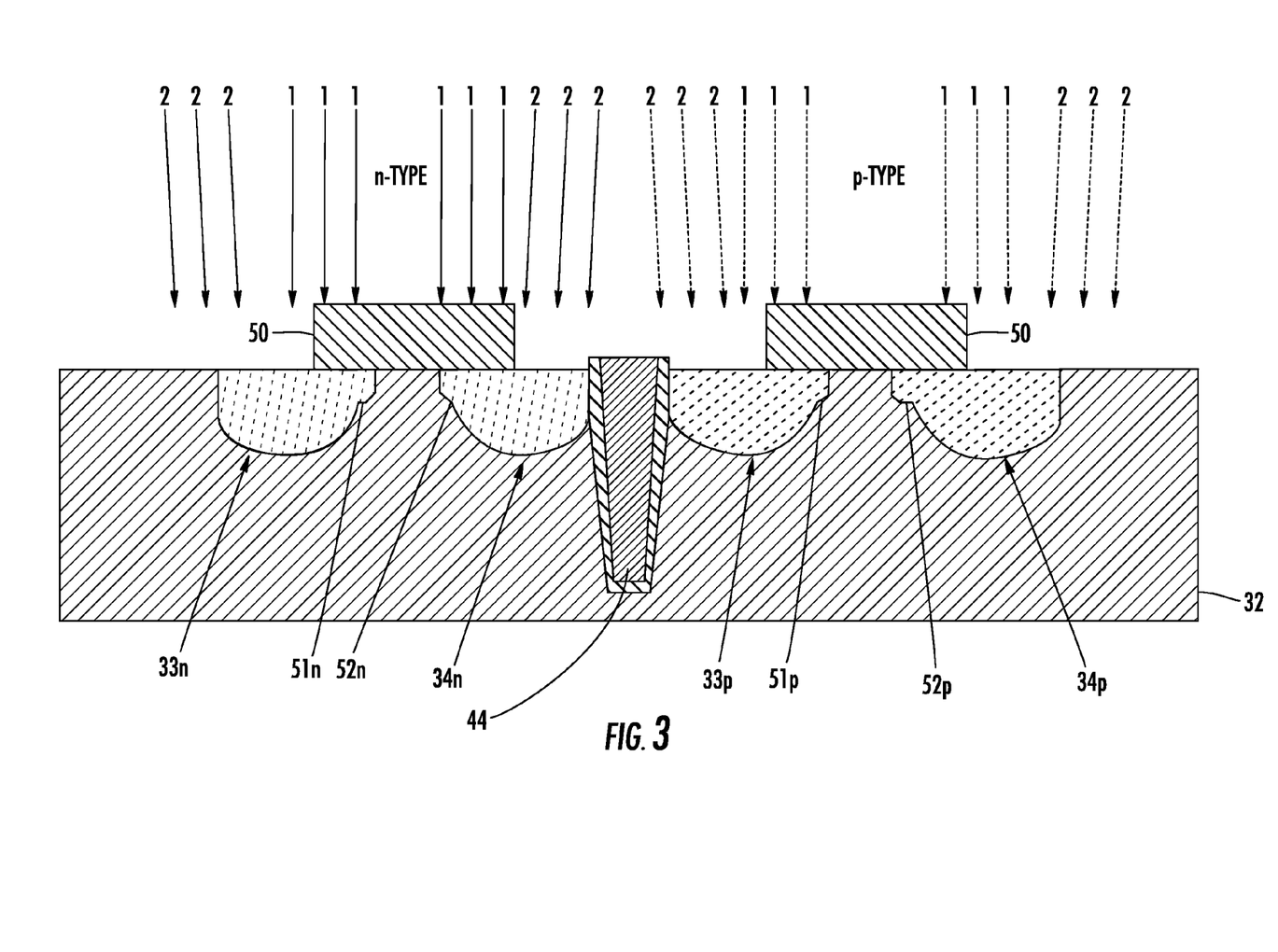

Referring initially to FIG. 1, an electronic device 30 is first described. In the illustrated example, the electronic device 30 is a complementary metal oxide semiconductor (CMOS) device including an N-type field effect transistor (NFET) 31$n$ and a P-type FET (PFET) 31$p$, although just NFETs or PFETs may be used in some embodiments. More particularly, the semiconductor device 30 includes a substrate 32, such as a silicon substrate, for example, although various types of substrates may be used (e.g., semiconductor on insulator (SOI), etc.). A shallow trench isolation (STI) region 44 separates the NFET 31$n$ from the PFET 31$p$ in the substrate 32. Source regions 33$n$, 33$p$ and drain regions 34$n$, 34$p$ for the NFET and PFET 31n, 31p, respectively, are formed in the substrate 32. As will be discussed further below, a respective recessed epitaxial channel layer 35n, 35p is recessed in the substrate 32 between the source and drain regions 33n, 34n and 33p, 34p, respectively.

A respective high-K gate dielectric layer 36, 36p overlies the recessed epitaxial channel layers 35n, 35p. The NFET 31n further illustratively includes a gate electrode overlying the high-K gate dielectric layer 36n, which for the NFET 31n includes an inner metal gate electrode portion 37n and an outer metal barrier portion 38n. The PFET 31p similarly includes a gate electrode including an inner metal gate electrode portion 37p, an outer metal barrier portion 38n, and a work function layer 39p on the outer metal barrier portion. A respective dielectric cap layer 40n, 40p is in contact with top and sidewall portions of the gate electrodes of the NFET 31n and PFET 31p. The dielectric cap layers 40n, 40p have lower dielectric constants than the respective high-K gate dielectric layers 36n, 36p. The NFET 31n and PFET 31p have respective source and drain contacts 41n, 42n and 41p, 42p coupled to the source and drain regions 33n, 34n and 33n, 33p via respective silicide regions 43n, 43p. It will be appreciated that while only a single NFET 31n and a single PFET 31p are shown in the accompanying drawings for clarity of illustration, in a bulk integration a plurality of NFETs and PFETs will be included in a semiconductor device.

A method for making the semiconductor device 31 will now be described with reference to FIGS. 2-15. The method includes forming the the STI region 44 in the substrate 32, which may be followed with chemical mechanical polishing (CMP) and formation of a first sacrificial layer 50 overlying the STI region and upper surface of the substrate. More particularly, the first sacrificial layer 50 may be a hard mask layer, such as a silicon nitride (SiN) layer, and may have a thickness in a range of 5 to 60 nm, for example, although other suitable materials and thicknesses may also be used.

Portions of the first sacrificial layer 50 may then be removed to expose the regions where the source regions 33n, 33p and drain regions 34n, 34p are to be formed (FIG. 3), yet the remaining portions of the first sacrificial layer cover the areas where the recessed epitaxial channel layers 35n, 35p are to be subsequently formed. The source regions 33n, 33p and drain regions 34n, 34p are formed by first implanting a "deep" source or drain implant (illustrated by no. 1 arrows in FIG. 3), followed by a "shallow" dopant implant (illustrated by no. 2 arrows) to form halo or lightly doped source or drain extension regions 51n, 52n and 51p, 52p. However, a halo implant need not be used in all embodiments.

Figure 4:
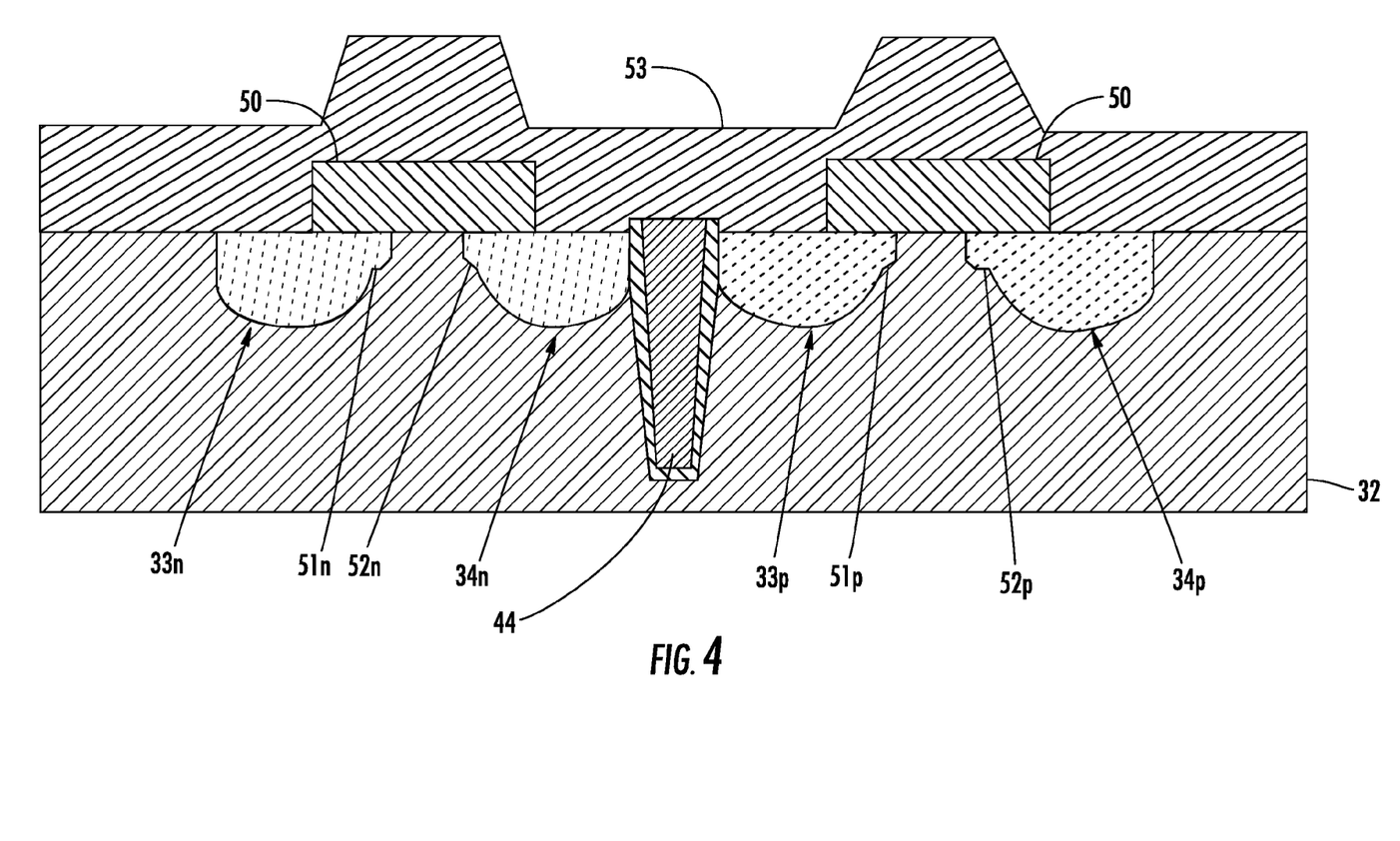
Figure 5:
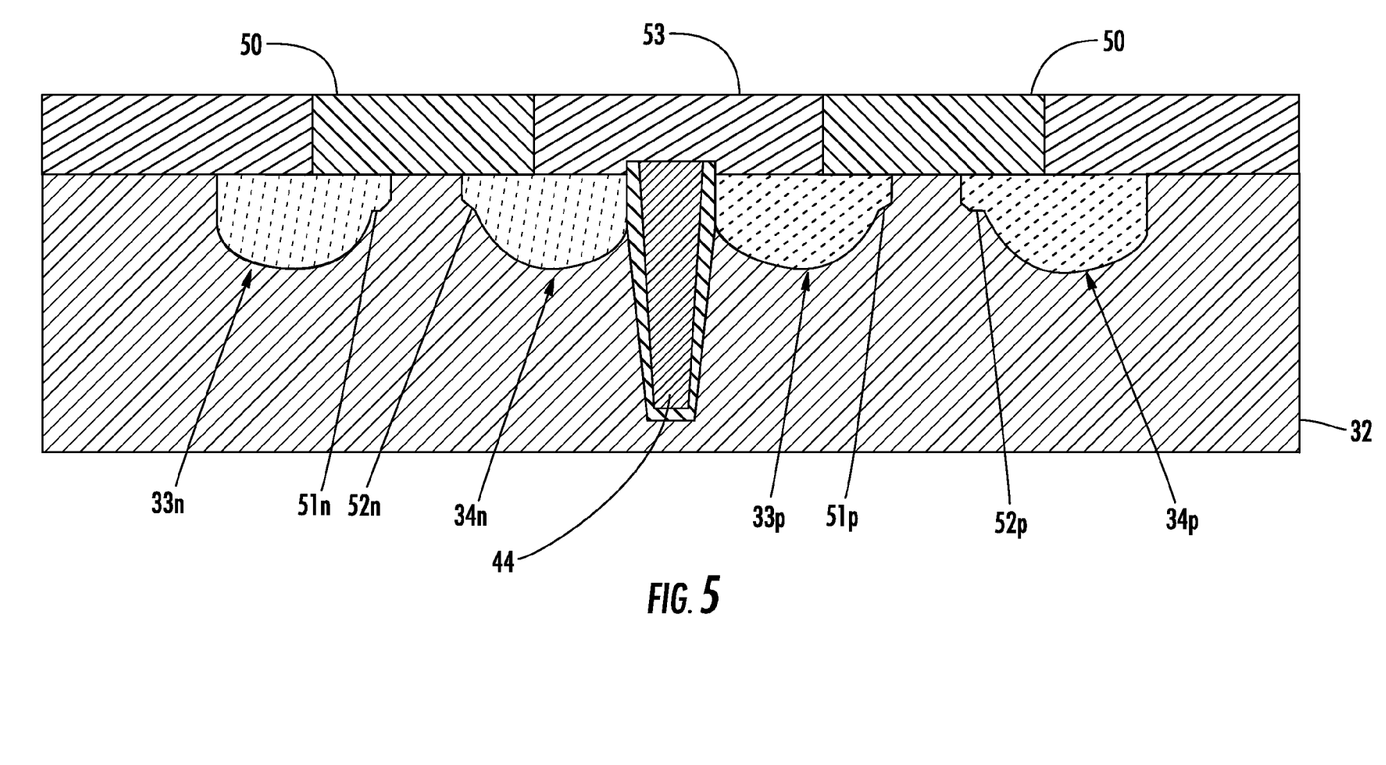
Figure 6:
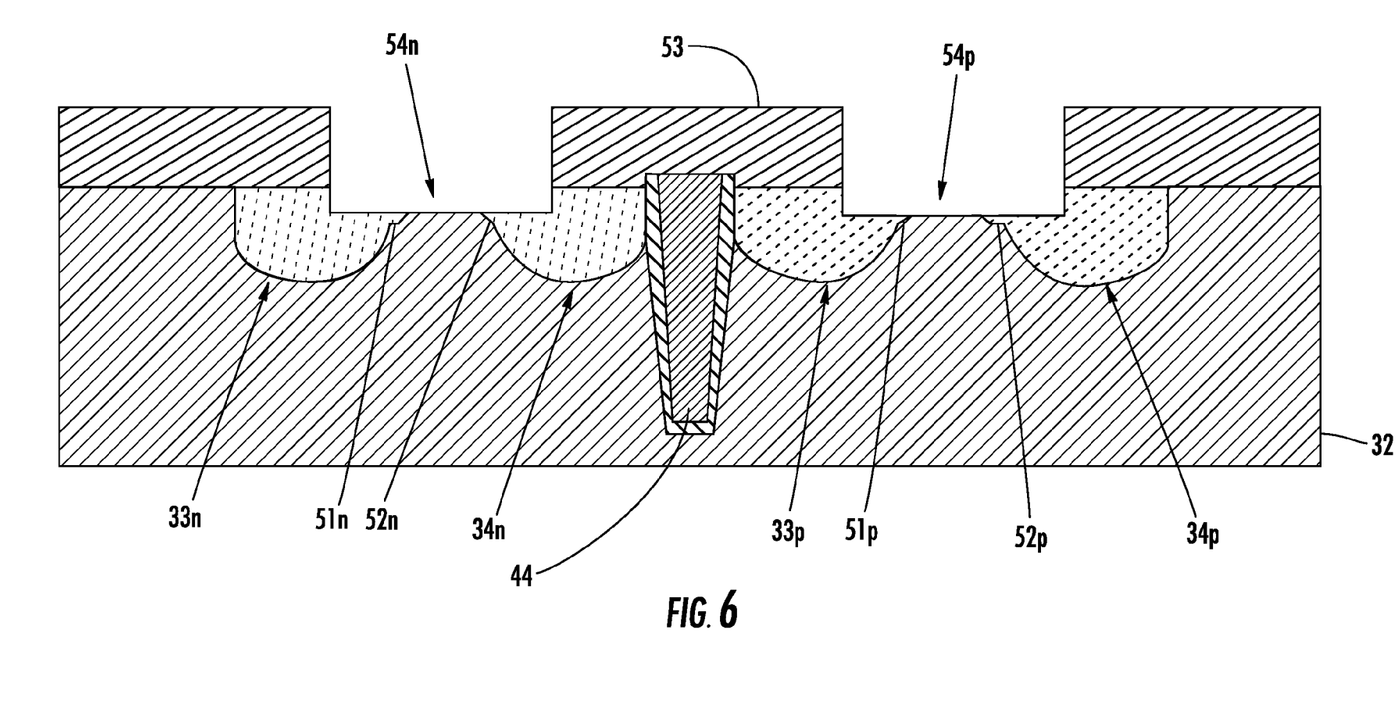

A second sacrificial layer or mask 53 may then be formed overlying the substrate 32 and portions of the first mask layer 50 respectively remaining between each pair of source and drain regions 33n, 34n and 33p, 34p, as shown in FIG. 4. By way of example, the second sacrificial layer 53 may comprise polysilicon, silicon oxide, SiCN, etc. Generally speaking, the second sacrificial layer 53 will be a different material than the first sacrificial layer 50, so that the remaining portions of the first sacrificial layer may be removed separately from the second sacrificial layer 53. More particularly, the second sacrificial layer 53 may be planarized (e.g., by CMP) to expose the remaining portions of the first sacrificial layer 50 (FIG. 5), and the remaining portions of the first sacrificial layer and underlying regions of the substrate 32 may be removed (e.g., by reactive ion etching (RIE)), which forms recesses 54n, 54p in the substrate 32 between the source and drain regions 33n, 34n and 33p, 34p, as shown in FIG. 6.

Forming the recesses for channel/gate region may provide certain advantages. For example, this may help to efficiently reduce the possibility of short channel effects (SCEs) in bulk devices. Moreover, since this approach results in raised source and drain regions with respect to the recessed epitaxial channel layers 35n, 35p, this may help to improve drain induced barrier lowering (DIBL) and sub-threshold slope (SS), as the drain (i.e., the halo drain regions 52n, 52p) will be at the same level as the epitaxial channel layers.

Figure 7:
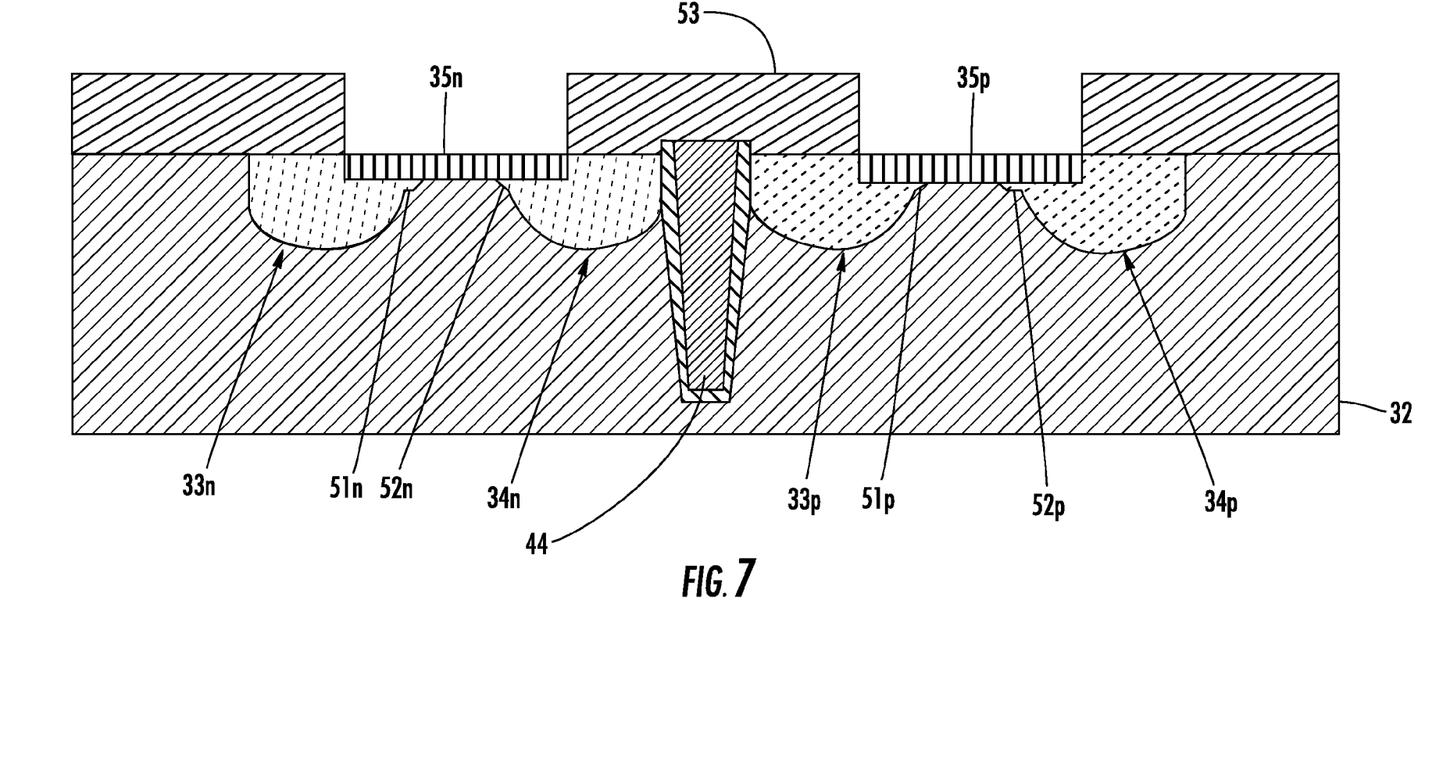

The channel layers 35n, 35p are selectively epitaxially grown in the respective recesses 54n, 54p, as shown in FIG. 7. For the illustrated CMOS configuration, the channel layer 35n may comprise epitaxial silicon, while the channel layer 35p may comprise epitaxial SiGe, for example, which may help provide improved PFET mobility. However, both channel layers 35n, 35p may be the same material in other embodiments, and different channel materials may also be used.

Figure 8:
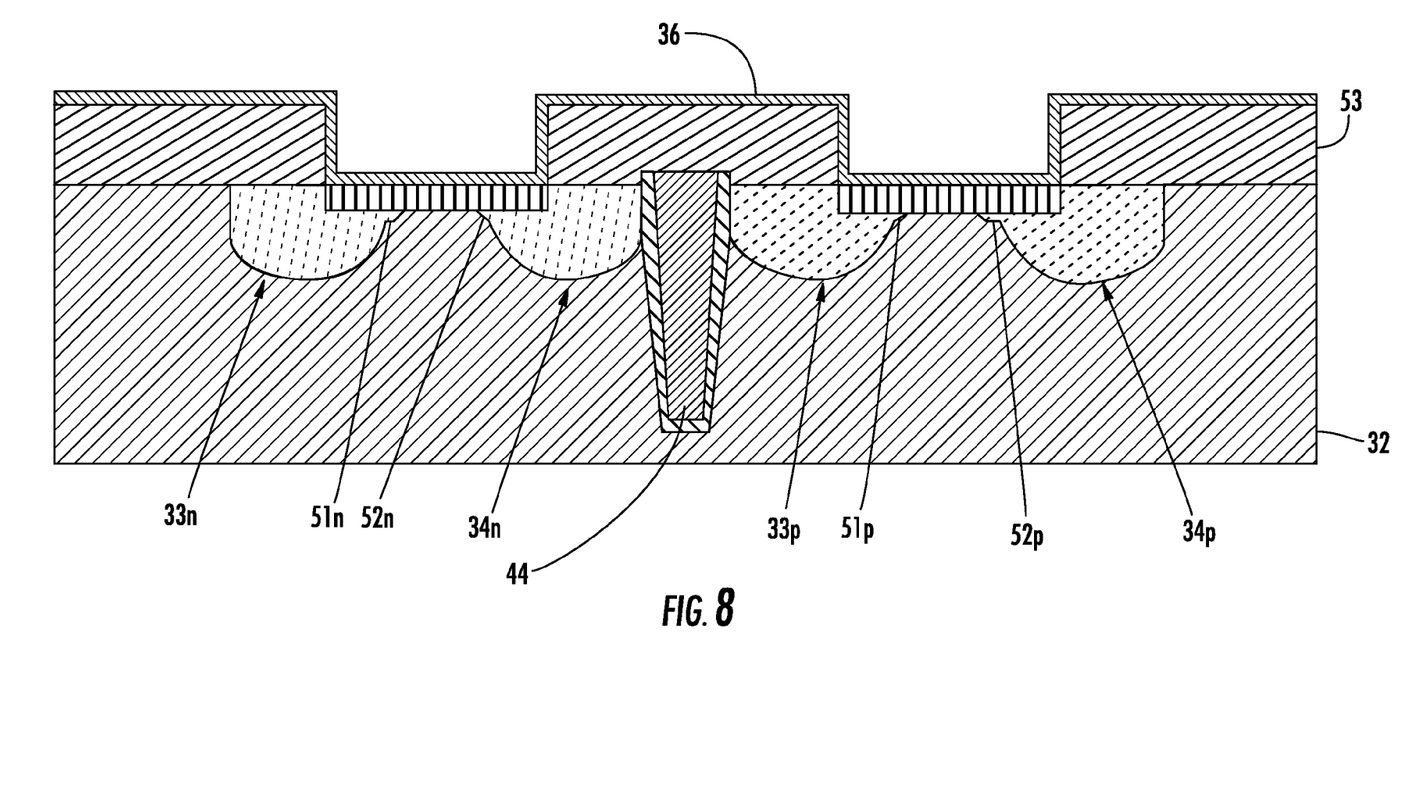

A high-K gate dielectric layer 36 (e.g., an oxide layer) is formed overlying the remaining portions of the second sacrificial layer 53 and the epitaxial channel layers 35n, 35p (FIG. 8). By way of example, the high-K gate dielectric layer 36 may have a dielectric constant of greater than 6, and example materials may include $HfO_2$ (k~20-25).

Figure 9:
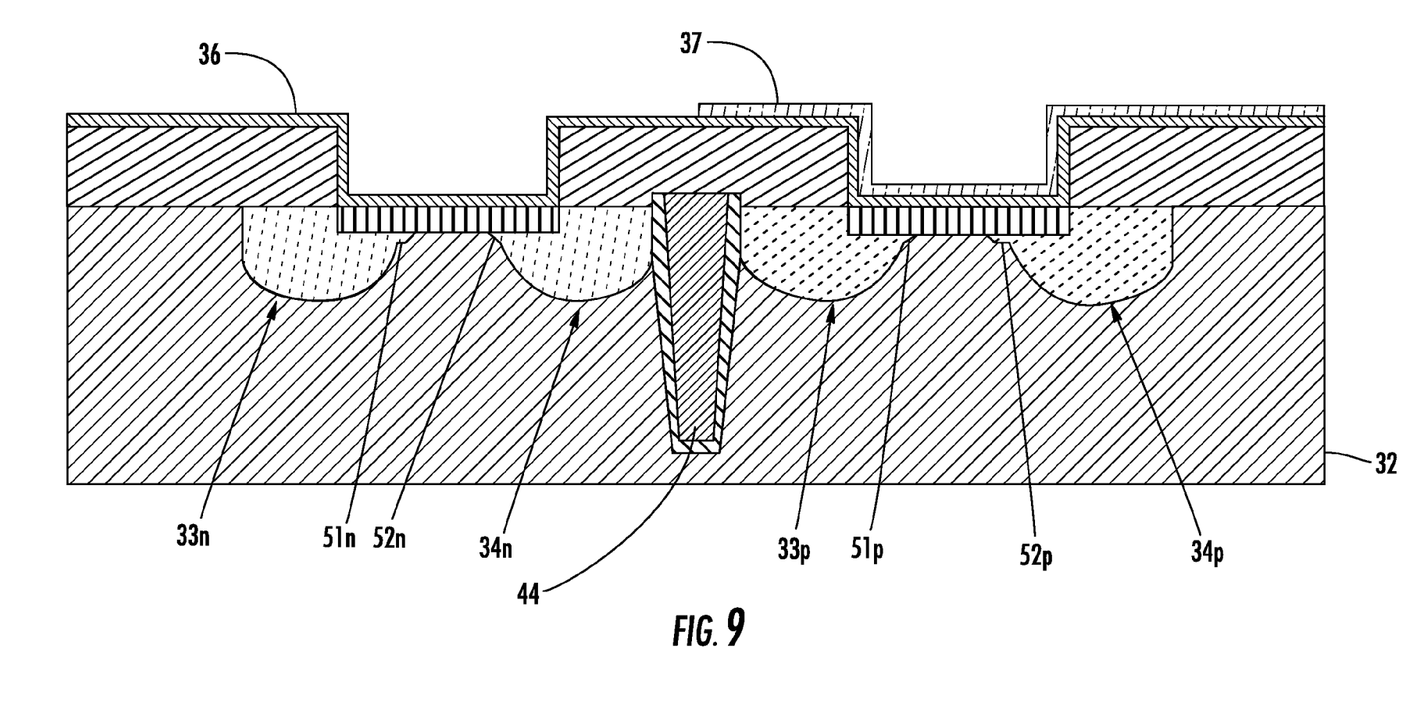
Figure 10:
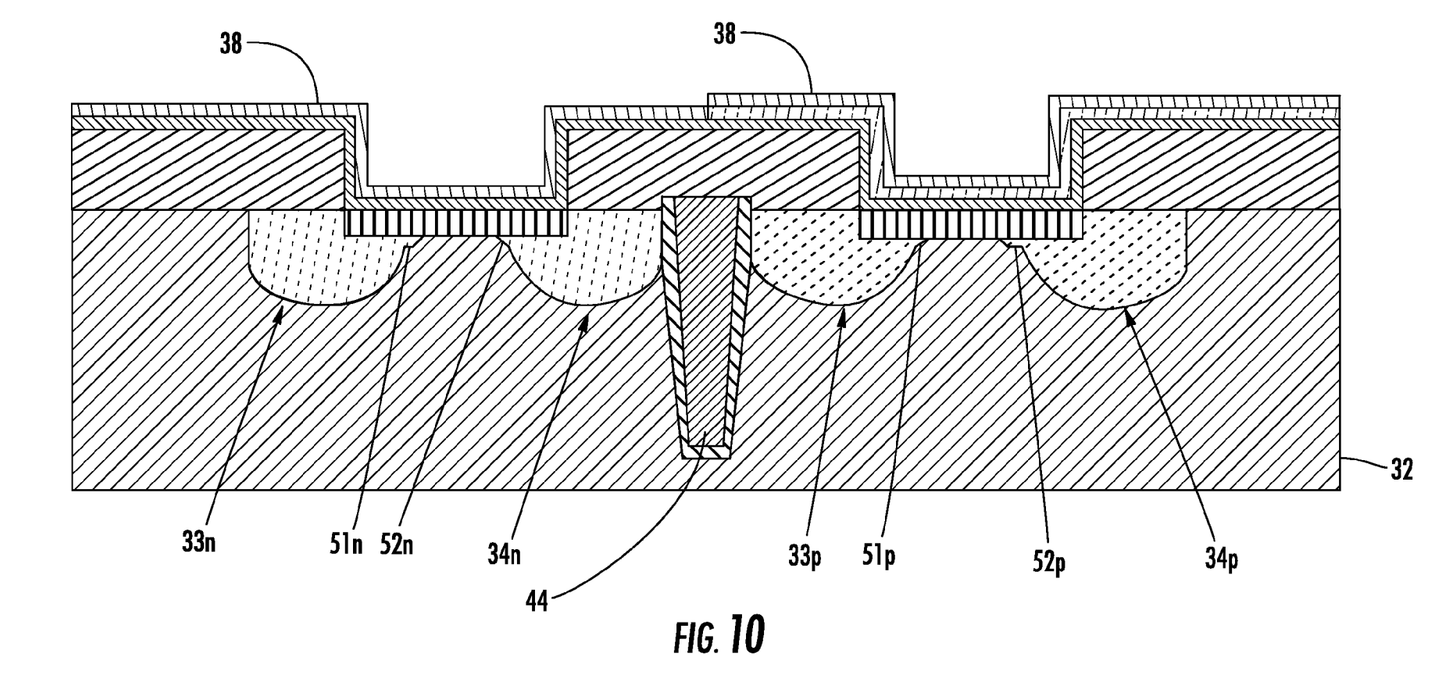
Figure 11:
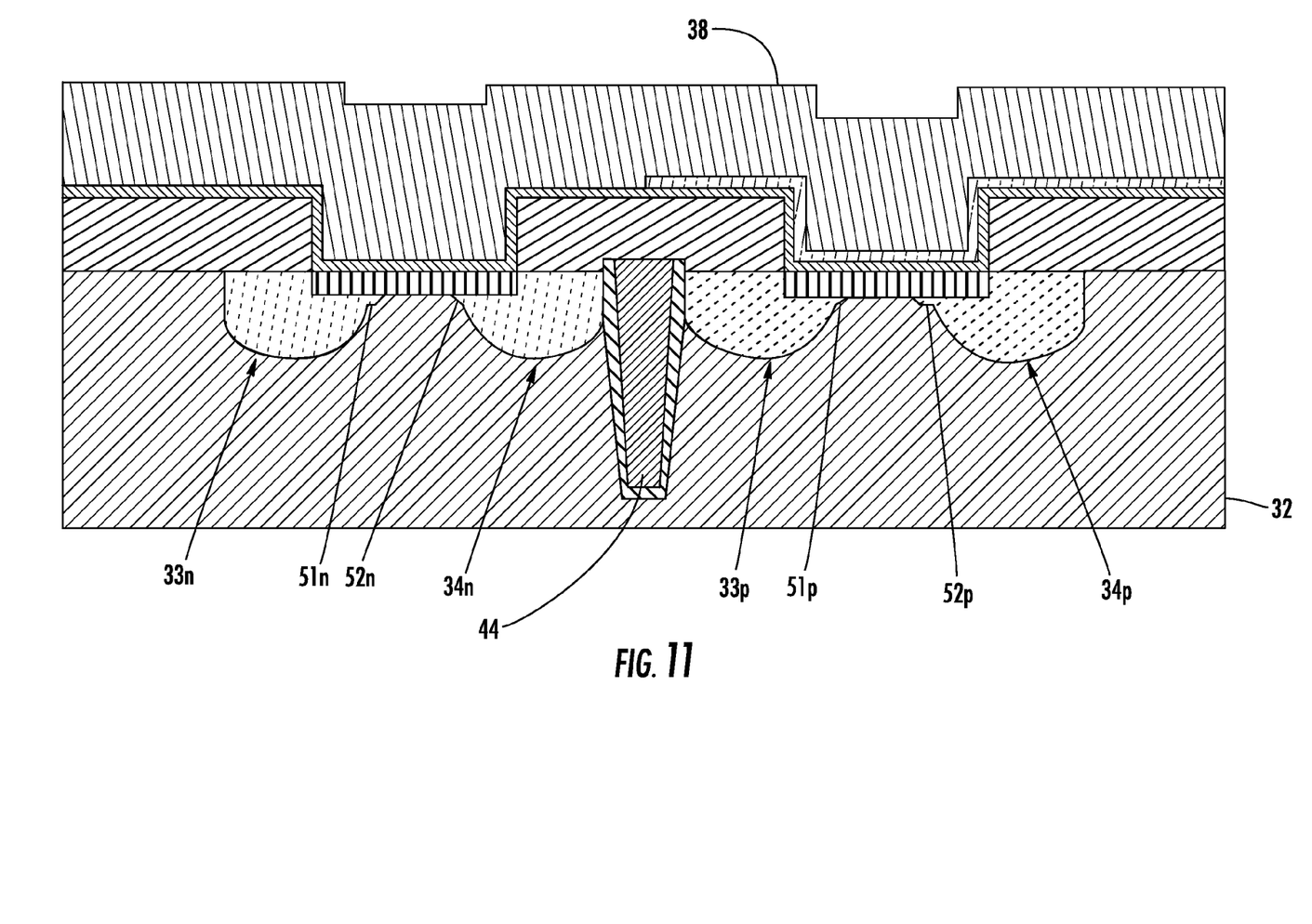

The PFET work function material layer 39p may then optionally be formed overlying the high K gate dielectric layer 36 on the PFET side of the substrate 32, as shown in FIG. 9. By way of example, the work function material may comprise TiN, although other suitable work function materials may also be used. Moreover, in some embodiments it may be desirable to also form an appropriate work function material layer for the NFETs of the device 30, as will be appreciated by those skilled in the art. A metal barrier/seed layer 38 may then be formed overlying the high K dielectric layer 36 (on the NFET side) and the work function layer 39p (on the PFET side), such as a TiNi layer, for example, although other suitable materials may also be used. A gate metal layer 37 may then be formed overlying the metal barrier/seed layer 38, as shown in FIG. 11. By way of example, the gate metal layer 37 may comprise a metal such as aluminum, tungsten, copper, etc.

Figure 12:
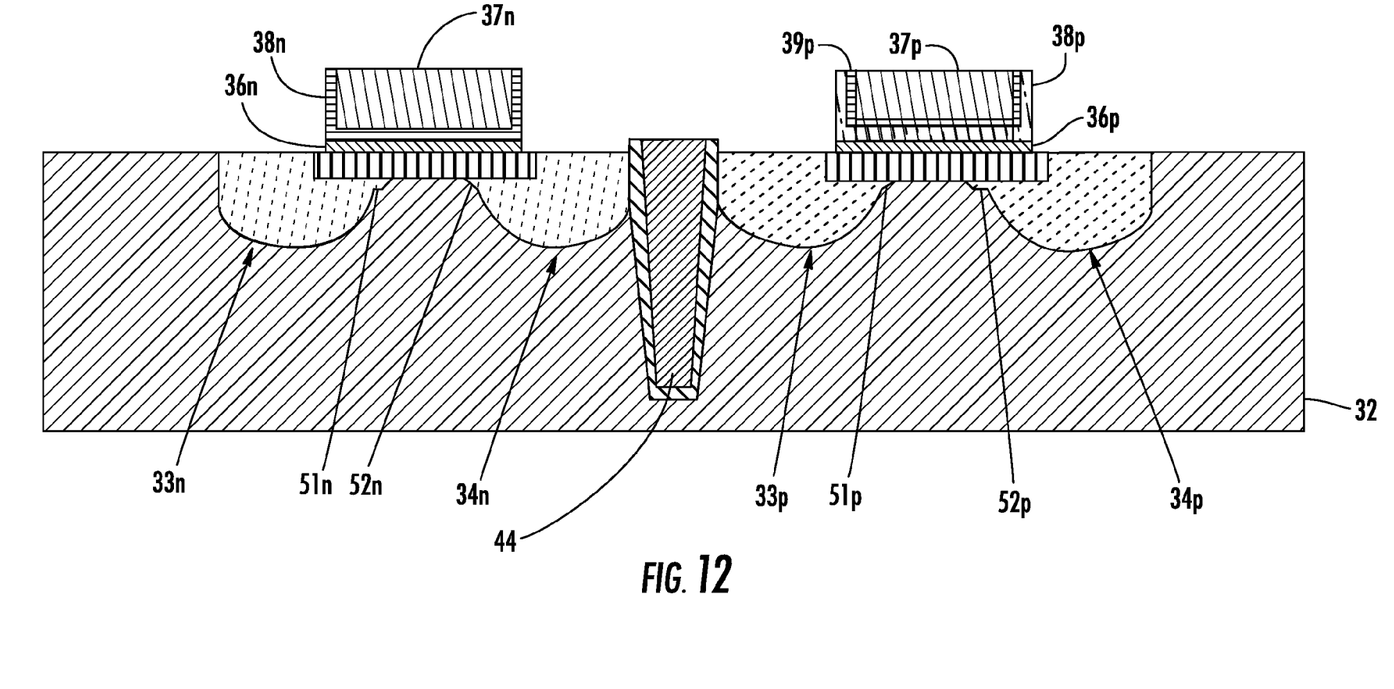

The gate metal layer 37, metal barrier/seed layer 38, and work function layer 39p may then be planarized (e.g., by CMP) down to the second sacrificial layer 53, and the second sacrificial layer portions may be removed to define the respective gate electrodes overlying each of the epitaxial channel layers, as shown in FIG. 12. The second sacrificial layer 53 may be removed by reactive ion etching (RIE), for example. Moreover, in the example illustrated in FIG. 12, the high K dielectric material formed on the sidewalls of the gate electrodes has also been removed, which may advantageously help improve the capacitance between the gate and the source and drain regions 33n, 34n and 33p, 34p, as will be discussed further below.

Figure 13:
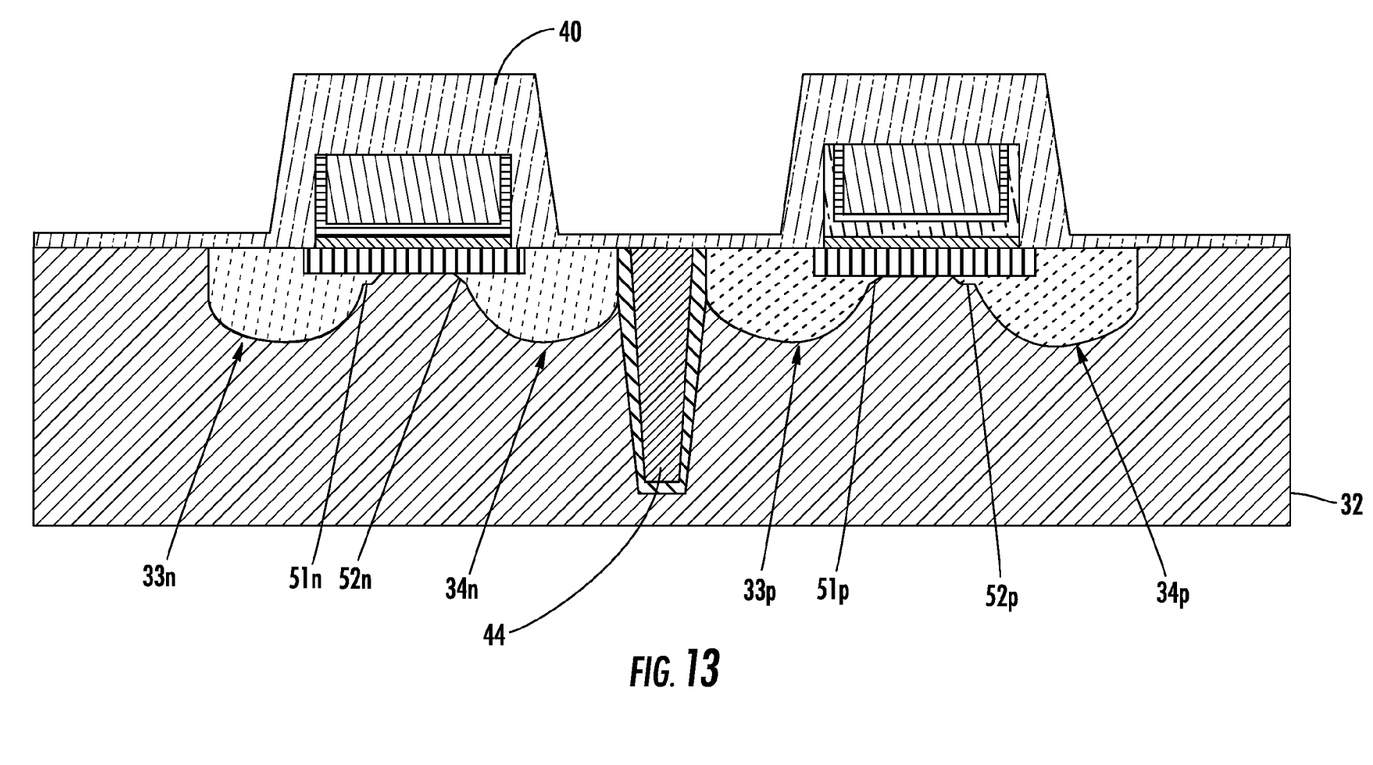
Figure 14:
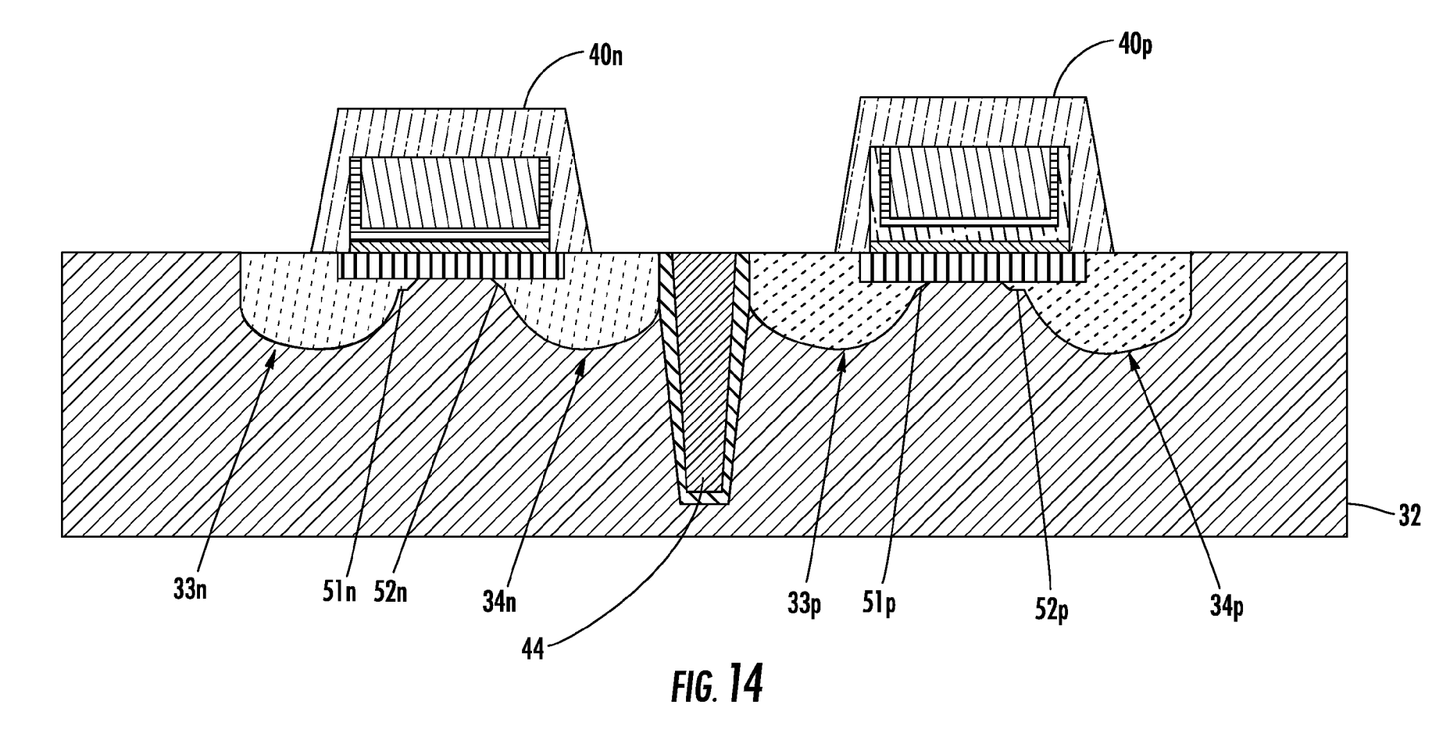

A dielectric cap layer 40 may then be formed overlying top and sidewall portions of each gate electrode and the substrate 32, as shown in FIG. 13, which may then be patterned to form the respective dielectric cap layer portions 40n, 40p (FIG. 14) using RIE or a wet cleaning step, for example. As noted above, the dielectric material used for the dielectric cap layer 40 may advantageously have a lower dielectric constant than that of the high K material used for the high K gate dielectric layer 36. Having the relatively low K material on the sidewalls of the gate electrode, as opposed to the high K material of the gate dielectric layer 36, advantageously provides for improved capacitive performance between the sources/drains and the gates, as mentioned above. By way of example, the low K dielectric cap material may have a dielectric constant in a range of 2 to 6, and more particularly 3 to 6. Example materials may include $SiO_2$, which has a dielectric constant of 3.9, SiBCN, which has a dielectric constant of 5.2, as well as carbon-doped $SiO_2$, which has a dielectric constant of 3.0, although other suitable materials may also be used in various embodiments.

Figure 15:
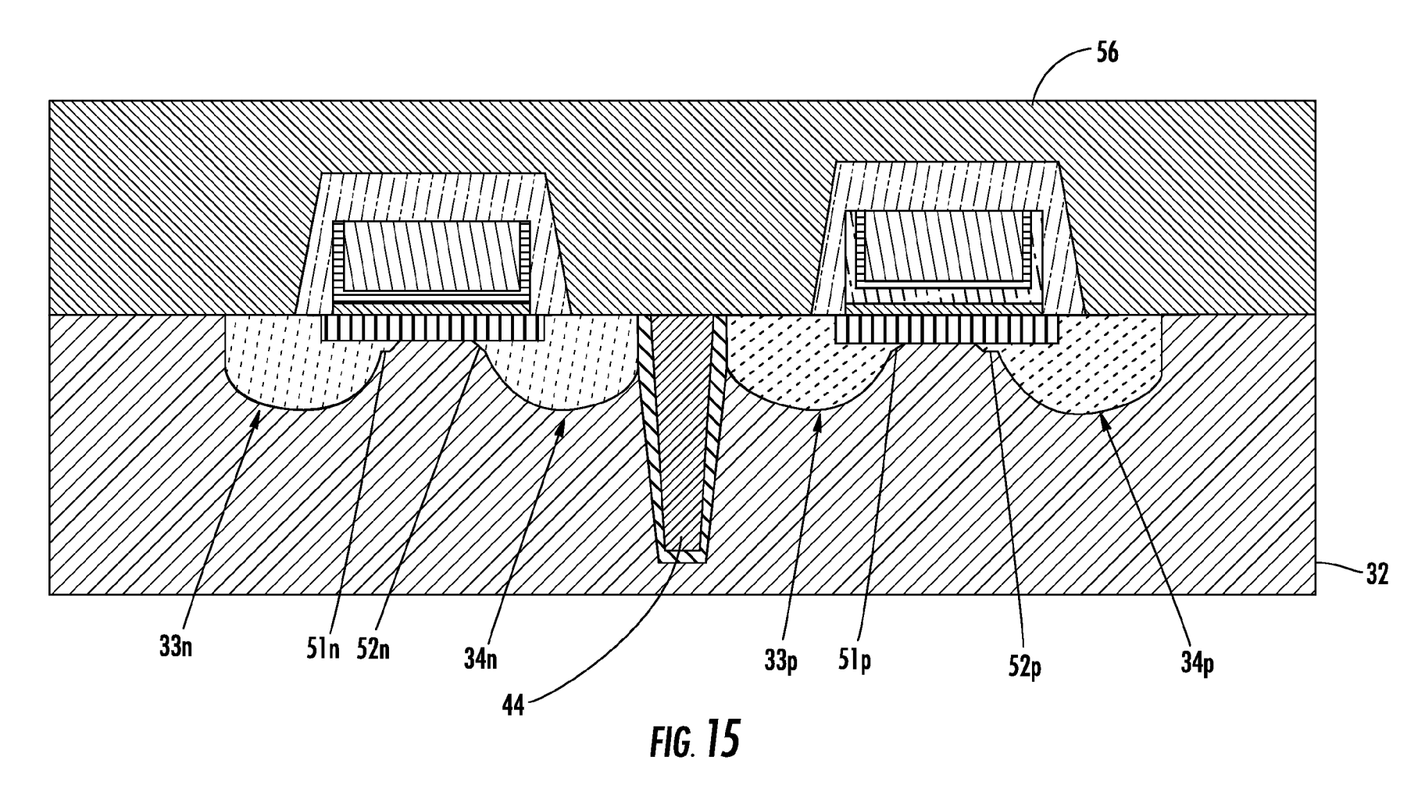

A contact dielectric layer (e.g., an oxide) may be formed overlying the substrate 32 and the dielectric cap layers 40n, 40p, as shown in FIG. 15. The contact dielectric material may also have a higher dielectric constant than the dielectric cap layers 40n, 40p. Regions of the contact dielectric layer 56 may then be removed to expose the source and drain regions, and the respective silicide regions 43n, 43p and metal source and drain contacts 41n, 42n and 41p, 42p may be formed within the etched regions of the contact dielectric layer to provide the structure shown in FIG. 1.

It will be appreciated that, as technology nodes continue to scale down, preventing short channel effects, improve drain induced barrier lowing (DIBL) and sub-threshold slope (SS) may be challenging for bulk devices. The above-described semiconductor device 31 and associated method aspects advantageously provide for the partial recessed gate raised source/drain configuration for improved DIBL and SS. Moreover, the partial recessed gate and the epitaxial channels (Si for the NFET and SiGe for PFET in the illustrated example) also help reduce SCEs. Furthermore, removal of the high K dielectric from the metal gate electrode sidewall allows for improved capacitance performance between the gate and the source/drain regions. Additionally, the dielectric cap layer on the metal gate electrodes allows for self-aligned source/drain contact openings, and the second sacrificial layer removal approach may allow for simplified gate processing and cost reductions, for example, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The which is claimed is:

1. A semiconductor device comprising:
a substrate;
source and drain regions in said substrate;
a recessed epitaxial channel layer in said substrate extending laterally above at least some portions of said source and drain regions;
a high-K gate dielectric layer overlying said recessed epitaxial channel layer;
a gate electrode overlying said high-K gate dielectric layer;
a dielectric cap layer in contact with top and sidewall portions of said gate electrode, said dielectric cap layer having a lower dielectric constant than said high-K gate dielectric layer; and
source and drain contacts coupled to said source and drain regions;
wherein the high-K gate dielectric layer terminates below a bottom level of the gate electrode.

2. The semiconductor device of claim 1 wherein said gate electrode comprises an inner metal gate electrode portion and an outer metal barrier portion.

3. The semiconductor device of claim 2 wherein said inner metal gate electrode portion comprises aluminum; and wherein said outer metal barrier portion comprises TaNi.

4. The semiconductor device of claim 2 wherein said gate electrode further comprises a work function layer on said outer metal barrier portion.

5. The semiconductor device of claim 4 wherein said work function layer comprises TiN.

6. The semiconductor device of claim 1 wherein said recessed epitaxial channel layer comprises at least one of silicon and germanium.

7. The semiconductor device of claim 1 wherein said source and drain contacts comprise metal.

8. The semiconductor device of claim 1 further comprising a shallow trench isolation (STI) region in said substrate.

9. The semiconductor device of claim 1 further comprising respective silicide regions between each of said source and drain regions and said source and drain contacts.

10. A semiconductor device comprising:
a substrate;
source and drain regions in said substrate, said source and drain contacts comprising metal;
a recessed epitaxial channel layer in said substrate extending laterally above at least some portions of said source and drain regions;
a high-K gate dielectric layer overlying said recessed epitaxial channel layer;
a gate electrode overlying said high-K gate dielectric layer, said gate electrode comprising an inner metal gate electrode portion and an outer metal barrier portion;
a dielectric cap layer in contact with top and sidewall portions of said outer metal barrier portion, said dielectric cap layer having a lower dielectric constant than said high-K gate dielectric layer; and
source and drain contacts coupled to said source and drain regions;
wherein the high-K gate dielectric layer terminates below a bottom level of the gate electrode.

11. The semiconductor device of claim 10 wherein said inner metal gate electrode portion comprises aluminum; and wherein said outer metal barrier portion comprises TaNi.

12. The semiconductor device of claim 10 wherein said gate electrode further comprises a work function layer on said outer metal barrier portion.

13. The semiconductor device of claim 12 wherein said work function layer comprises TiN.

14. The semiconductor device of claim 10 wherein said recessed epitaxial channel layer comprises at least one of silicon and germanium.

15. The semiconductor device of claim 10 further comprising a shallow trench isolation (STI) region in said substrate.

16. The semiconductor device of claim 10 further comprising respective silicide regions between each of said source and drain regions and said source and drain contacts.

* * * * *